United States Patent [19]
Cahill et al.

[11] Patent Number: 5,410,741
[45] Date of Patent: Apr. 25, 1995

[54] AUTOMATIC GAIN CONTROL OF TRANSPONDED SUPERVISORY AUDIO TONE

[75] Inventors: Stephen V. Cahill, Palatine; Edward M. Roney, IV, Grayslake, both of Ill.

[73] Assignee: Motorola Inc., Schaumburg, Ill.

[21] Appl. No.: 35,778

[22] Filed: Mar. 23, 1993

[51] Int. Cl.⁶ .................................... H04B 7/005
[52] U.S. Cl. ............................ 455/69; 455/234.1; 455/245.1; 375/345
[58] Field of Search .......... 455/69, 70, 234.1, 234.2, 455/239.1, 245.1, 250.1, 84, 88, 116; 375/96, 98

[56] References Cited

U.S. PATENT DOCUMENTS

| | | | |
|---|---|---|---|
| 5,001,742 | 3/1991 | Wang | 379/60 |
| 5,040,194 | 8/1991 | Tjahjadi et al. | 455/234.1 |
| 5,081,670 | 1/1992 | Reum | 379/29 |
| 5,107,225 | 4/1992 | Wheatley, III et al. | 455/239.1 |
| 5,199,045 | 3/1993 | Kato | 455/88 |

*Primary Examiner*—Reinhard J. Eisenzopf
*Assistant Examiner*—Thanh C. Le
*Attorney, Agent, or Firm*—Dale B. Halling

[57] ABSTRACT

The process of the present invention encompasses a method for automatically controlling the gain of a transponded modulation signal. The process receives a demodulated signal, detects whether SAT is present, and transmits the SAT. Before transmission, the transmitted SAT is adjusted for the gain of the modulator and for the gain of the receiver.

3 Claims, 2 Drawing Sheets

AUTOMATIC GAIN CONTROL OF TRANSPONDED SUPERVISORY AUDIO TONE

FIELD OF THE INVENTION

The present invention relates generally to the field of communications and particularly to automatic gain control of a signal.

BACKGROUND OF THE INVENTION

Landline telephony uses supervision to detect changes in the switch-hook state caused by the telephone user. Mobile telephone supervision also performs this process but must also ensure that adequate RF signal strength and interference protection is maintained. This is accomplished by the supervisory audio tone (SAT), a continuous out-of-band modulated signal.

Three SAT signals are used in the United States cellular system, AMPS. These SAT signals are at 5970 Hz, 6000 Hz, and 6030 Hz. Only one of these frequencies is employed at a given cell site.

The SAT operates by the mobile unit receiving the SAT from the base station and transponding it back to close the loop. The base station looks for the return of the specific SAT it sent out. If another SAT is returned, the cell interprets this as the call between the mobile and the cell being corrupted by interference.

When a mobile receives a signal from the base station, it detects whether SAT is present. Based on this frequency, the mobile generates its own SAT and transmits it back to the base station. This method requires the mobile to perform a large number of million instructions per second (MIPS) in order to detect the received SAT and generate the transmitted SAT.

Consumers are demanding smaller cellular telephones for greater portability. To reduce the size of the telephones, the number of parts in the telephone must be reduced. This can be accomplished by performing many of the telephone's functions in a digital signal processor (DSP). This, in effect, replaces a number of integrated circuits with a single DSP that performs the same function as the replaced ICs.

Replacing the present SAT detection and generation circuits with a DSP would require a very MIPS intensive process. This would take up time the DSP could be used for other tasks. Additionally, the received SAT must be adjusted for gain differences caused by the mobile's hardware before it is transmitted back to the base station. This would take additional time away from the DSP. There is a resulting need for a simple process to detect SAT and adjust its gain.

SUMMARY OF THE INVENTION

The process of the present invention encompasses a method for automatically controlling the gain of a transmitted modulation signal. This control is based on a received demodulated signal. The process filters the received signal to produce a filtered signal. This filtered signal is processed by an autocorrelation function to generate a plurality of autocorrelation values. A desired energy of the filtered signal is divided by at least one of the autocorrelation values to produce a preliminary gain adjustment signal. A further gain is derived from the preliminary gain adjustment signal by taking the square root of the preliminary gain adjustment signal. The derived gain is scaled in response to the gain of the modulator that modulates the transmitted signal. This device gain is filtered to produce a filtered gain signal. The transmitted signal is generated in response to the filtered gain signal and the filtered signal.

DETAILED DESCRIPTION OF THE PREFERRED EMBODIMENT

Figure 1:
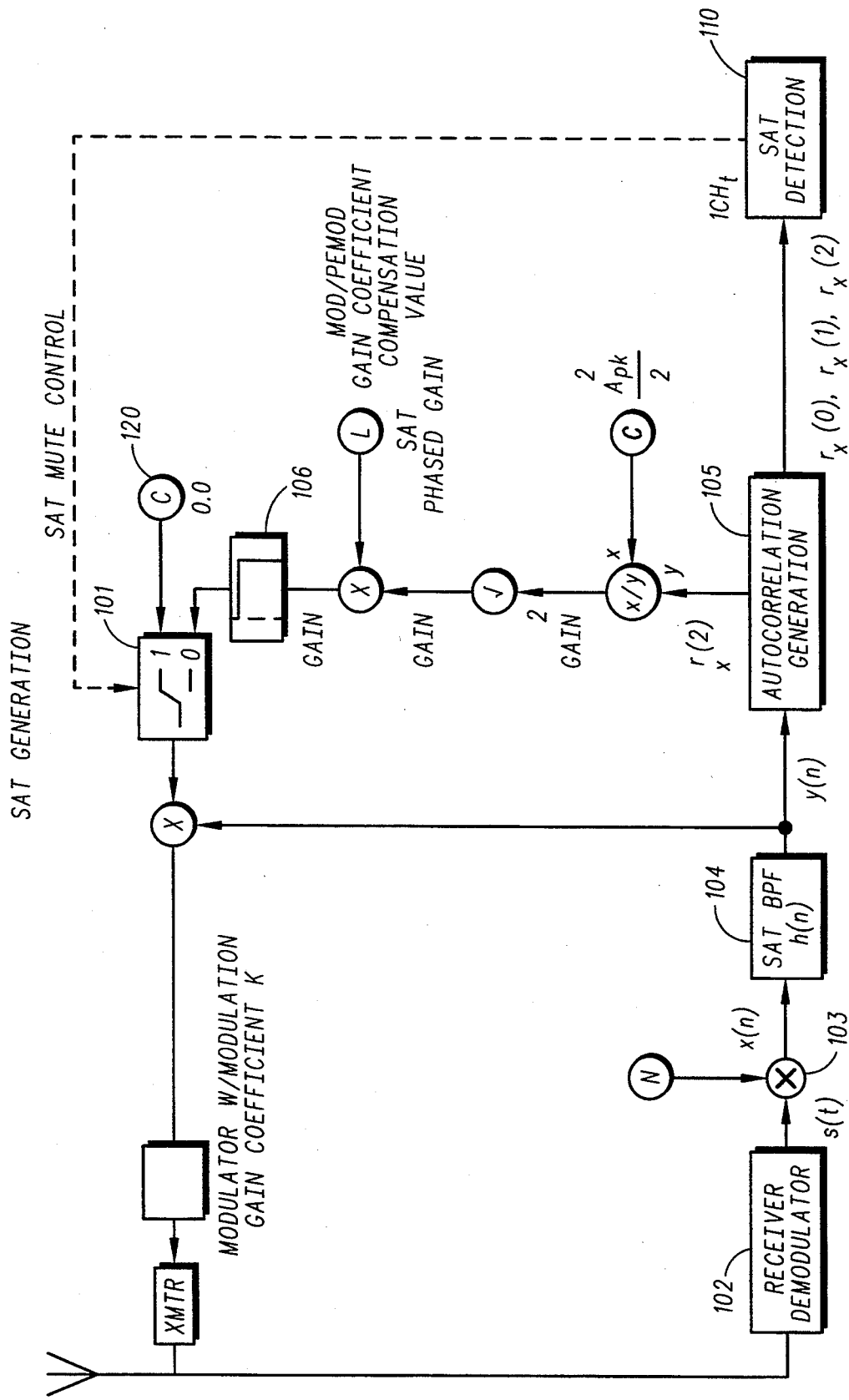
FIG. 1 shows a block diagram of the process of the present invention.

The process of the present invention enables a SAT detection and automatic gain control (AGC) process to be incorporated into a DSP without requiring a large amount of processing time. This process is illustrated in the block diagram of FIG. 1.

The process begins by the received signal being demodulated (102). This demodulation process produces a signal whose rms value is affected by both the received signal and the gain of the demodulator. This affect is removed by multiplying (103) the demodulated signal by the value N. N is chosen so that for a known received signal, the signal at the input to the bandpass filter (104) is known; i.e., N is adjusted for each radiotelephone to remove the effects of demodulator gain variance from radiotelephone to radiotelephone.

To illustrate this adjustment, one embodiment of the present invention might have a received signal with an approximate 2.0 kHz deviation at a 6.0 kHz rate. The actual received signal may be other than exactly 2.0 kHz deviation, but the transmitted signal needs to be exactly, or substantially close to a 2.0 kHz deviation independent of the exact received signal deviation. The transponded received signal, therefore, needs to have its gain adjusted as the demodulated received signal varies.

For a received signal with a 2.0 kHz deviation at a 6.0 kHz rate, a demodulated signal, s(t) is produced. This signal is then sampled and gain adjusted to produce a discrete signal, x(n), with an rms value D. x(n) is then filtered by a narrowband bandpass filter (104) characterized by transfer function h(n) whose output, y(n) has rms value E. The BPF (104) removes speech and noise so that y(n) is a fairly close representation of SAT.

y(n) is input to an autocorrelation function calculator (105) that generates outputs $r_x(0)$, $r_x(1)$, and $r_x(2)$. These output values are the energy of each sample of the sampled signal, x(n). $r_x(0)$ for an input sine wave of rms value E has value $E^2$.

The radiotelephone's transmitter also has a variance from radiotelephone to radiotelephone for effective transmit deviation. To produce a known deviation, the modulation level must be adjusted to compensate for this variance. This is done by adjusting the value of the constant L for each individual radiotelephone.

The process of the present invention performs SAT modulation gain adjustment by using the $E^2$ value to derive a gain adjustment for the output signal prior to its passage to the transmitter. This adjustment is performed by the process of the present invention by scaling the signal, y(n) to produce a signal of amplitude G. An input sinusoidal signal of rms value G is required at the input of the transmitter to produce a 2.0 kHz deviated signal at the transmitter output.

G is determined by the following equation:

$$G = L \times \left( \sqrt{\frac{A_{pk}^2}{2}} \right)$$

where the values for $$\frac{A_{pk}^2}{2}$$

and L are chosen so that for an autocorrelation output of $E^2$, a signal of rms value G is generated if y(n) is at the correct frequency and within an amplitude window, as determined by the SAT detector.

The output of the above operation is input to a low pass filter (LPF) (106). The LPF (106) reduces the variance of the gain adjustment signal to keep the transmitted signal from experiencing large amplitude changes.

The output of the LPF (106) is one input to a switching operation (101). If SAT is detected by the SAT detector (110), the output of the LPF (106) is used in subsequent operations. If SAT is not detected, the gain of the transmitted signal is set to zero.

Figure 2:
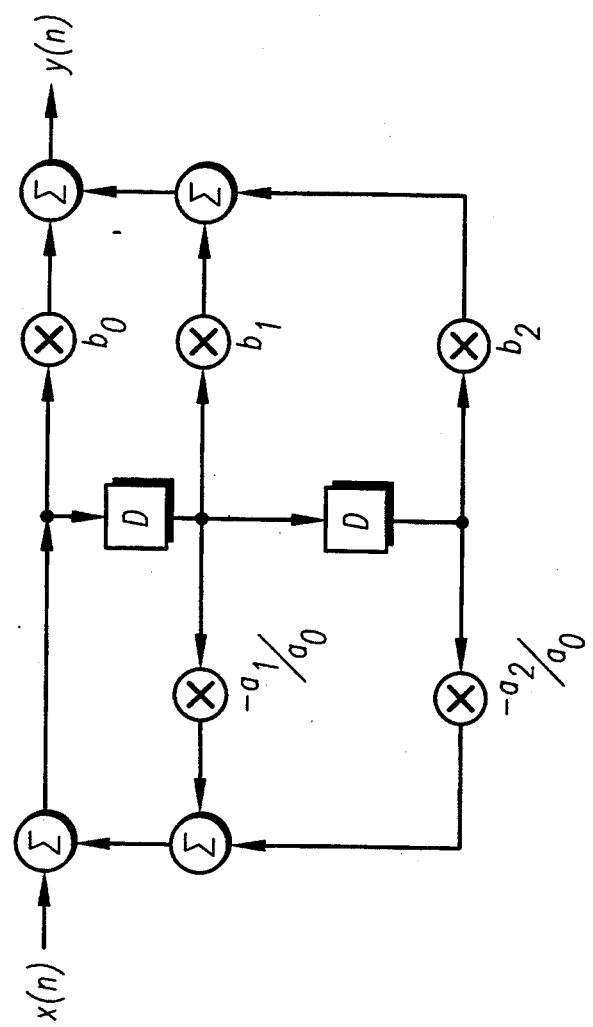
FIG. 2 shows a block diagram of the SAT detection process of the present invention.

The SAT detector (110) of the present invention determines the presence of the SAT signal by the amplitude and frequency characteristics of the received signal. To accomplish this, the process illustrated in FIG. 2 is used.

This process begins by the autocorrelation values from the autocorrelation calculator being input to the SAT detector. Using the Levinson-Durbin recursive process, direct form coefficients are generated from the autocorrelation values. The pole locations of the autocorrelation values are then generated by inputting the coefficients into a quadratic equation. The frequency of the received signal is then determined by these pole locations. The amplitude characteristic is derived via $r_x(0)$ and and compared with a possibly variable threshold. If $E^2$, as measured by $r_x(0)$ is above the threshold, the received SAT is determined to have sufficient amplitude to be detected, if the frequency, as determined by pole locations, is acceptable.

The SAT frequency detection process can be represented mathematically as follows. The z—transform of a sine wave is:

$$\sin(\omega t) <=> \frac{z\sin(\omega T)}{z^2 - 2z\cos(\omega T) + 1}$$

where:

$$\omega = 2\pi f_0 \left( f_0 \leq \frac{1}{2T} \right)$$

and T=sampling rate.
This can also be written as:

$$\sin(\omega t) <=> \frac{z^{-1}\sin(\omega T)}{1 - 2z^{-1}\cos(\omega T) + z^{-2}}$$

The equation for a second order linear time-invariant discrete-time system is:

$$H(z) = \frac{b_0 + b_1 z^{-1} + b_2 z^{-2}}{a_0 - a^1 z^{-1} - a_2 z^{-2}}$$

Equating the coefficients of the sine function with that of H(z) gives:

$b_0 = 0 \quad\quad a_0 = 1$
$b_1 = \sin(\omega T) \quad\quad a_1 = 2\cos(\omega T)$
$b_2 = 0 \quad\quad a_2 = -1$ Since the frequency of the received signal is wanted, the frequency of a sinusoidal signal can be explicitly represented by the denominator of H(z). The numerator of H(z) gives only gain information. Using the quadratic equation to find the pole locations in the z-domain gives:

$$z = \frac{a_2(1) \pm \sqrt{a_2^2(1) + 4a_2(0)a_2(2)}}{2}$$

The frequency of the received sinusoidal signal is:

$$f_0 = \tan^{-1}\left( \frac{\sqrt{a_2^2(1) + 4a_2(0)a_2(2)}}{a_2(1)} \right) \cdot \frac{T}{2\pi}.$$

The denominator coefficients of the second-order linear time-invariant discrete-time system can be easily determined by using the Levinson-Durbin recursive process. The Levinson-Durbin recursive process for determining the direct form coefficients is as follows, where $\hat{r}_{xx}(m)$ is the unbiased estimate of the true autocorrelation.

$$\hat{r}_{xx}(m) = \frac{1}{N - M} \sum_{n=0}^{N-M-1} X[n + M] \cdot X^*[n]$$

where:
X(n)=discrete data sample,
N=analysis length.

Now $r_{xx}(0)$, $r_{xx}(1)$, and $r_{xx}(2)$, the autocorrelation values from the autocorrelation calculator, are used to calculate the direct form coefficients.

$a_2(0) = 1$
$a_2(1) = a_1(1) + \Gamma_2 \cdot a_1(1)$
$a_2(2) = \Gamma_2$ where $a_1(1) = \Gamma_1 = -\frac{r_{xx}(1)}{r_{xx}(0)}$.

$$\Gamma_2 = \frac{[r_{xx}^2(2) + a_1(1) \cdot r_{xx}(1)] \cdot r_{xx}(0)}{r_{xx}^2(1) - r_{xx}^2(0)}$$

$$\Gamma_2 = \frac{r_{xx}(2)r_{xx}(0) - r_{xx}^2(1)}{r_{xx}^2(1) - r_{xx}^2(1)}$$

$a_2(0) = 1$ $$a_2(1) = r_{xx}(1) \cdot \left[ \frac{r_{xx}(0) - r_{xx}(2)}{(r_{xx}(1) - r_{xx}(0))(r_{xx}(1) + r_{xx}(0))} \right]$$

$$a_2(2) = \frac{r_{xx}(2)r_{xx}(0) - r_{xx}^2(1)}{r_{xx}^2(1) - r_{xx}^2(0)}$$

$$a_2(1) = r_{xx}(1) \cdot \left[ \frac{r_{xx}(0) - r_{xx}(2)}{r_{xx}^2(1) - r_{xx}^2(0)} \right].$$

If the frequency of the signal is determined to be either 5970 Hz±10 Hz, 6000 Hz±10 Hz, or 6030 Hz±10 Hz, SAT is present in the received signal. If SAT is present, the SAT detector (110) enables the switching function (101) to allow the gain adjusted signal through. If SAT is not present, the SAT detector (110) enables the switching function (101) to output a mute control (120) signal.

We claim:

1. A method for automatically controlling the gain of a transmitted modulation signal based on a received demodulated signal, the transmitted signal modulated by a modulator having a gain, the method comprising the steps of:
    filtering the received signal to produce a filtered signal;
    generating at least one autocorrelation value in response to the filtered signal;
    dividing a desired energy of the filtered signal by at least one of the at least one autocorrelation values to produce a preliminary gain adjustment signal;
    deriving a further gain from the preliminary gain adjustment signal by finding the square root of the preliminary gain adjustment signal;
    scaling the derived gain by a predetermined value;
    filtering the scaled gain to produce a filtered gain signal; and
    generating the transmitted modulation signal in response to the filtered gain signal and the filtered signal.

2. The method of claim 1 wherein the desired energy is a constant.

3. A method for automatically controlling the gain of a transmitted modulation signal based on a received demodulated signal having an amplitude and a frequency, the transmitted signal modulated by a modulator having a gain, the method comprising the steps of:
    filtering the received signal to produce a filtered signal;
    generating a plurality of autocorrelation values in response to the filtered signal;
    dividing a desired energy of the filtered signal by at least one of the autocorrelation values to produce a preliminary gain adjustment signal;
    deriving a further gain from the preliminary gain adjustment signal by finding the square root of the preliminary gain adjustment signal;
    scaling the derived gain by a predetermined value;
    filtering the scaled gain to produce a filtered gain signal;
    detecting the frequency and amplitude characteristics of the received signal in response to the plurality of correlation values;
    if the frequency and amplitude characteristics are not each within predetermined ranges, muting the transmitted modulation signal; and
    if the frequency and amplitude characteristics are each within predetermined ranges, adjusting the gain of the transmitted signal in response to the filtered gain signal and the filtered signal.

* * * * *

UNITED STATES PATENT AND TRADEMARK OFFICE
CERTIFICATE OF CORRECTION

PATENT NO. : 5,410,741
DATED : April 25, 1995
INVENTOR(S) : Cahill et al.

It is certified that error appears in the above-indentified patent and that said Letters Patent is hereby corrected as shown below:

In column 4, line 63: Please replace "$r^2_{xx}(1) - r^2_{xx}(1)$" with --$r^2_{xx}(1) - r^2_{xx}(0)$--.

Signed and Sealed this

Eighteenth Day of July, 1995

Attest:

BRUCE LEHMAN

*Attesting Officer*         *Commissioner of Patents and Trademarks*